(12) United States Patent
Hwang

(10) Patent No.: US 8,506,710 B2
(45) Date of Patent: Aug. 13, 2013

(54) APPARATUS FOR FABRICATING SEMICONDUCTOR DEVICE

(75) Inventor: Jung-Woo Hwang, Gumisi (KR)

(73) Assignee: LG Display Co., Ltd., Seoul (KR)

( * ) Notice: Subject to any disclaimer, the term of this patent is extended or adjusted under 35 U.S.C. 154(b) by 1141 days.

(21) Appl. No.: 11/158,395

(22) Filed: Jun. 22, 2005

(65) Prior Publication Data

US 2006/0001848 A1 Jan. 5, 2006

(30) Foreign Application Priority Data

Jun. 30, 2004 (KR) .................. 10-2004-0050174

(51) Int. Cl.
*C23C 16/455* (2006.01)
*C23C 16/00* (2006.01)
*H01L 21/3065* (2006.01)

(52) U.S. Cl.
USPC .............. 118/715; 118/723 E; 118/723 R; 156/345.29; 156/345.33; 156/345.43; 156/345.47

(58) Field of Classification Search
USPC .......... 118/715, 723 E, 723 R; 156/345.33, 156/345.29, 345.34, 345.43, 345.47
See application file for complete search history.

(56) References Cited

U.S. PATENT DOCUMENTS

| | | | | |
|---|---|---|---|---|
| 3,805,736 A * | 4/1974 | Foehring et al. | ............. | 118/719 |
| 4,817,558 A * | 4/1989 | Itoh | ............... | 118/725 |
| 5,269,847 A * | 12/1993 | Anderson et al. | ............. | 118/715 |
| 5,704,981 A * | 1/1998 | Kawakami et al. | ........... | 118/715 |
| 5,710,486 A * | 1/1998 | Ye et al. | ................. | 315/111.21 |
| 5,916,369 A * | 6/1999 | Anderson et al. | ............. | 118/715 |
| 5,962,085 A * | 10/1999 | Hayashi et al. | ............... | 427/585 |
| 6,070,551 A * | 6/2000 | Li et al. | ........................ | 118/723 I |
| 6,143,081 A * | 11/2000 | Shinriki et al. | ............... | 118/719 |
| 6,444,039 B1 * | 9/2002 | Nguyen | ........................ | 118/715 |
| 6,709,523 B1 * | 3/2004 | Toshima et al. | ............... | 118/725 |
| 8,282,768 B1 * | 10/2012 | Smargiassi et al. | ...... | 156/345.33 |
| 8,337,619 B2 * | 12/2012 | Carlson et al. | ............... | 118/715 |
| 8,349,403 B2 * | 1/2013 | Takasuka et al. | .......... | 427/248.1 |
| 8,398,816 B1 * | 3/2013 | Gytri et al. | ................. | 156/345.5 |
| 2003/0049372 A1 * | 3/2003 | Cook et al. | ................. | 427/248.1 |
| 2003/0192646 A1 * | 10/2003 | Wu et al. | .................. | 156/345.49 |
| 2006/0001848 A1 * | 1/2006 | Hwang | ........................ | 355/30 |
| 2006/0275546 A1 * | 12/2006 | Arena et al. | ............... | 427/248.1 |
| 2009/0148704 A1 * | 6/2009 | Takasuka et al. | .......... | 428/411.1 |
| 2010/0092668 A1 * | 4/2010 | Hegedus | ................. | 427/255.28 |
| 2012/0024227 A1 * | 2/2012 | Takasuka et al. | ............. | 118/715 |
| 2012/0240853 A1 * | 9/2012 | Carlson et al. | ............... | 118/715 |

FOREIGN PATENT DOCUMENTS

KR 20-0173020 12/1999
KR 1020040014760 A 2/2004

OTHER PUBLICATIONS

Office Action issued in corresponding Korean Patent Application No. 10-2004-0050174, mailed Dec. 20, 2010.

* cited by examiner

*Primary Examiner* — Jeffrie R Lund
(74) *Attorney, Agent, or Firm* — Brinks Hofer Gilson & Lione

(57) ABSTRACT

An apparatus for fabricating a semiconductor device includes: a chamber having a sidewall; a susceptor in the chamber; a plurality of injection holes in the sidewall, the plurality of injection holes disposed along a horizontal direction; and a plurality of exhaust holes in the sidewall, the plurality of exhaust holes disposed along the horizontal direction and facing the plurality of injection holes with the susceptor therebetween.

15 Claims, 6 Drawing Sheets

APPARATUS FOR FABRICATING SEMICONDUCTOR DEVICE

The present application claims the benefit of Korean Patent Application No. 2004-0050174 filed in Korea on Jun. 30, 2004, which is hereby incorporated by reference.

BACKGROUND

1. Technical Field

The present invention relates to an apparatus for fabricating a semiconductor device, and more particularly, to an apparatus for fabricating a liquid crystal display device.

2. Discussion of the Related Art

In general, a liquid crystal display (LCD) device includes a first substrate and a second substrate separated from each other by having a liquid crystal layer interposed therebetween, wherein the first substrate has a black matrix, a color filter layer including red, green and blue sub-color filters and a common electrode, and the second substrate has a switching element and a pixel electrode. When a voltage is supplied to the common electrode and the pixel electrode, an electric field is generated that changes the orientation of liquid crystal molecules of the liquid crystal layer due to optical anisotropy within the liquid crystal layer. Consequently, light transmittance characteristics of the liquid crystal layer are modulated and images are displayed by the LCD device.

Recently, an active matrix type LCD device has become widely used where a plurality of pixel regions are disposed in matrix and a switching element, such as a thin film transistor (TFT), is formed in each pixel region. The TFT is fabricated through the repetition of thin film-forming steps and photolithographic processes for the thin films including a photoresist-patterning step and a thin film-etching step.

The thin film-forming and thin film-etching steps are performed in an isolated vacuum space using reaction gases. An apparatus including a chamber is used for the thin film-forming and thin film etching steps, where a substrate is disposed in the chamber defining a vacuum reaction space isolated from the exterior surroundings. An apparatus including a chamber may be classified into two types according to the method of supplying and distributing reaction gases into a chamber: a shower head type and a side flow type. In a shower head type apparatus, the reaction gases are supplied into a top portion of the chamber and flow downwardly though the chamber to a bottom portion of the chamber. In a side flow type apparatus, the reaction gases are supplied into one side portion of the chamber and laterally flow over a substrate to the other side portion of the chamber.

FIG. 1 is a schematic cross-sectional view showing a side flow type apparatus including a chamber according to the related art. In FIG. 1, a side flow type apparatus includes a chamber 10, an upper electrode 20 and a lower electrode 30. The chamber 10 is a vacuum reaction space isolated from the exterior surroundings, and the upper and lower electrodes 20 and 30 are disposed in the chamber 10. The upper and lower electrodes 20 and 30 face each other with a substrate 2 disposed therebetween. The upper electrode 20 includes a backing plate 22, which functions as one electrode for generating and maintaining a plasma. The lower electrode 30 includes a susceptor 32, which functions as the other electrode for generating and maintaining the plasma. Radio frequency (RF) power is applied between the upper and lower electrodes 20 and 30. In addition, the lower electrode 30 functions as a chuck supporting the substrate 2.

An injection slit 12 and an exhaust slit 14 are formed through a sidewall of the chamber 10. The injection slit 12 and the exhaust slit 14 face each other and the substrate 2 is disposed between the injection slit 12 and the exhaust slit 14. The injection slit 12 and the exhaust slit 14 are horizontally disposed. Reaction gases supplied to the chamber are injected into the chamber 10 through the injection slit 12 and flow along a top surface of the substrate 2 and are exhausted out of the chamber 10 through the exhaust slit 14. For the above-mentioned flow path of the reaction gases, the injection slit 12 is connected to a gas supply system through an inlet pipe 16 and the exhaust slit 14 is connected to a vacuum system such as a pump through an output pipe 18.

After the substrate 2 is transferred into the chamber 10 and loaded on the susceptor 32, the RF power is applied between the backing plate 22 and the susceptor 32, and the reaction gases are injected into the chamber 10 through the injection slit 12. The injected reaction gases are excited due to the RF power form a plasma. As a result, a thin film may be formed on the substrate 2 by the plasma or a thin film on the substrate 2 may be etched by the plasma. During the plasma treatment process, the reaction gases are continuously exhausted out of the chamber 10 through the exhaust slit 14 to maintain a vacuum condition of the chamber 10.

FIG. 2 is a schematic perspective view showing a side flow type apparatus including a chamber according to the related art. In FIG. 2, the injection slit 12 and the exhaust slit 14 facing each other is formed through the sidewall of the chamber 10. The injection slit 12 and the exhaust slit 14 are horizontally disposed with a height of about 2 mm.

In the side flow type apparatus having the injection slit 12 and the exhaust slit 14, however, since the injection slit 12 and the exhaust slit 14 are disposed in local places in the chamber 10, a pressure of the reaction gases varies with position in the chamber 10. The variation of the pressure of the reaction gases causes a variation in amount of injected gases and in amount of exhausted gases, thereby causing a non-uniformity in the plasma treatment process. For example, a film is not uniformly deposited on the substrate 2 or a film on the substrate 2 is not uniformly etched.

As referring again to FIGS. 1 and 2, the reaction gases are supplied to the chamber 10 through the inlet pipe 16. Since the inlet pipe 16 has a width narrower than the injection slit 12, the reaction gases are abruptly diffused into chamber 10 at the injection slit 12. Accordingly, the reaction gases are not uniformly distributed in the chamber 10 and the pressure of the distributed reaction gases varies with position in the chamber 10. As a result, the amount of the distributed reaction gases varies with position in the chamber, which causes a non-uniformity in the plasma treatment process.

Similarly, since the processed reaction gases are evacuated through the outlet pipe 18 having a width narrower than the exhaust slit 14, the processed reaction gases are abruptly concentrated into the exhaust slit 14. Accordingly, the processed reaction gases are not uniformly evacuated from the chamber 10 and the pressure variation of the reaction gas with position in the chamber 10 is enlarged. As a result, the variation in the amount of the reaction gases and the non-uniformity in the plasma treatment process increases. The non-uniformity in the plasma treatment process results in deterioration of the thin film and causes deterioration in display quality of the LCD device.

BRIEF SUMMARY

Accordingly, the present invention is directed to an apparatus for fabricating a semiconductor device that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an apparatus for fabricating a semiconductor device includes: a chamber having a sidewall; a susceptor in the chamber; a plurality of injection holes in the sidewall, the plurality of injection holes disposed along a horizontal direction; and a plurality of exhaust holes in the sidewall, the plurality of exhaust holes disposed along the horizontal direction and facing the plurality of injection holes with the susceptor therebetween.

In another aspect an apparatus for fabricating a semiconductor device includes a chamber having a plurality of injection holes and a plurality of exhaust holes for transport of reaction gases through the chamber in a flow direction from the plurality of injection holes toward the plurality of exhaust holes; gas supply apparatus and gas exhaust apparatus coupled to the chamber; and first structure in communication with the plurality of injection holes and the gas supply apparatus and second structure in communication with the plurality of exhaust holes and the gas exhaust apparatus, wherein the first and second structure change the flow of the reaction gas with respect to the flow direction.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments, examples of which are illustrated in the accompanying drawings.

Figure 1:
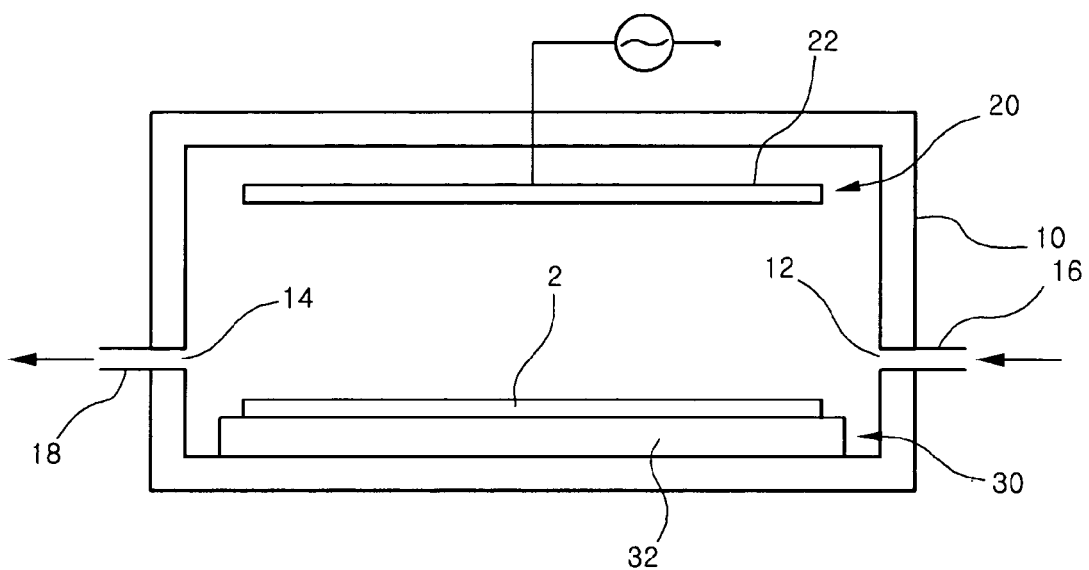
FIG. 1 is a schematic cross-sectional view showing a side flow type apparatus including a chamber according to the related art.
Figure 2:
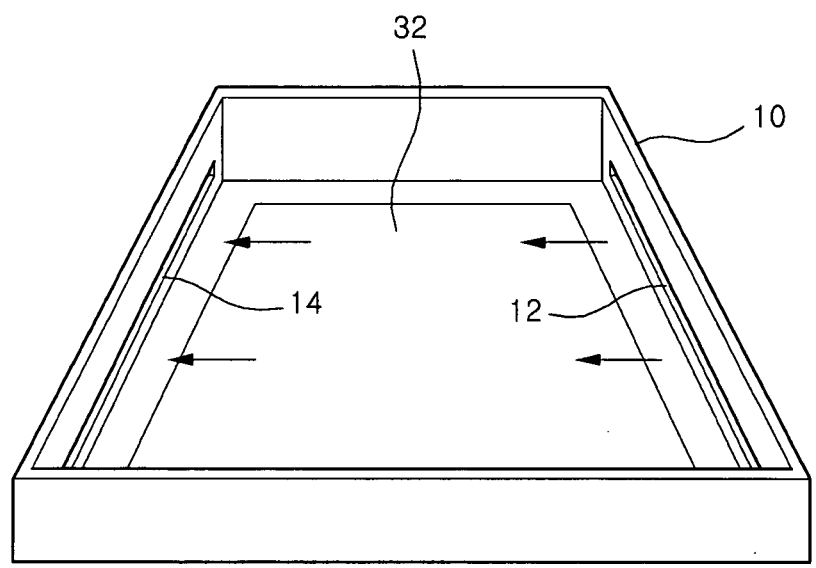
FIG. 2 is a schematic perspective view showing a side flow type apparatus including a chamber according to the related art.
Figure 3:
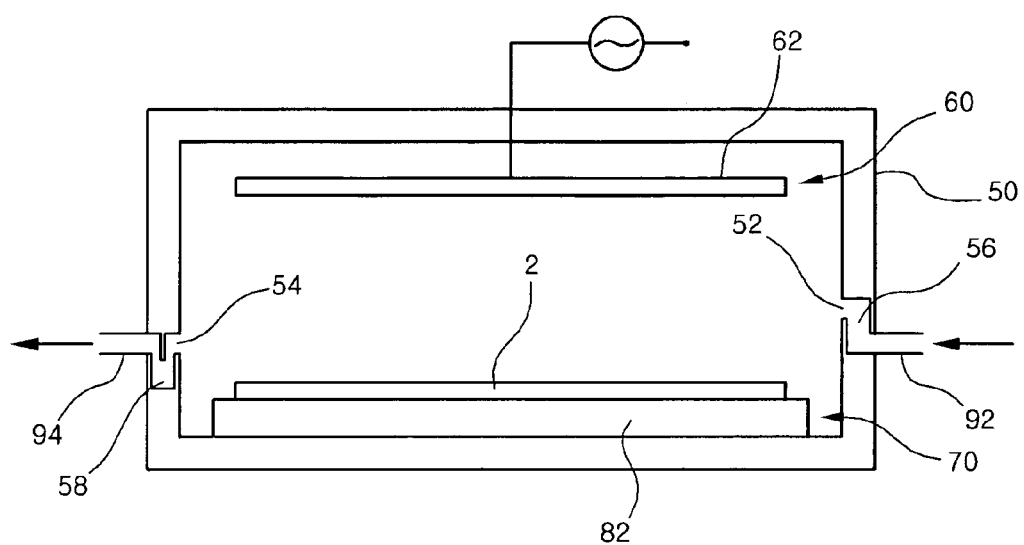
FIG. 3 is a schematic cross-sectional view of an apparatus according to an exemplary embodiment of the present invention.
Figure 4:
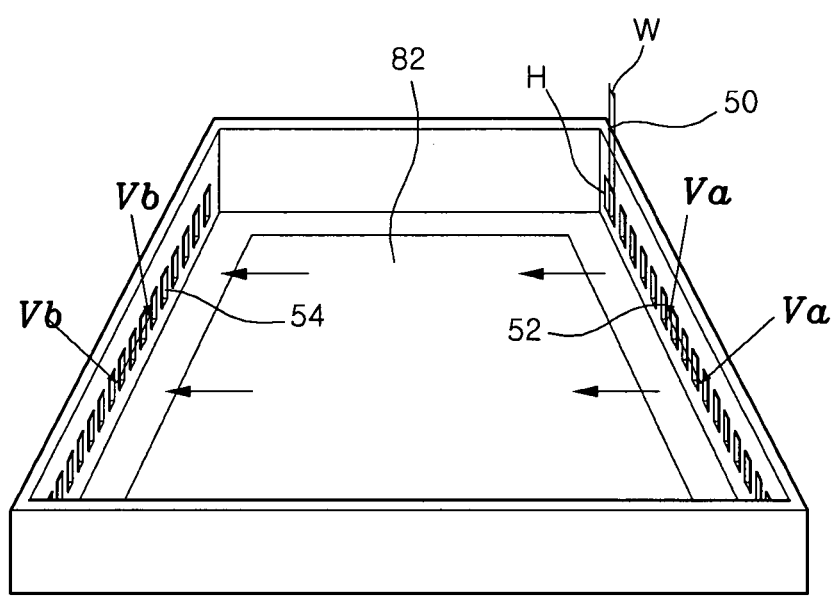
FIG. 4 is a perspective view of an apparatus according to an exemplary embodiment of the present invention.

FIGS. 3 and 4 are a schematic cross-sectional view and a schematic perspective view of an apparatus according to an exemplary embodiment of the present invention.

In FIG. 3, a side flow type apparatus includes a chamber 50, an upper electrode 60 and a lower electrode 70. The chamber 50 is a vacuum reaction space isolated from the exterior surroundings, and the upper and lower electrodes 60 and 70 are disposed in the chamber 50. The upper and lower electrodes 60 and 70 face each other with a substrate 2 disposed therebetween. The upper electrode 60 may include a backing plate 62 functioning as one electrode for generating and maintaining plasma. The lower electrode 70 may include a susceptor 82 functioning as the other electrode for generating and maintaining the plasma. The susceptor 82 may include a metallic material such as aluminum (Al) or a graphite material coated with aluminum (Al) for grounding. A radio frequency (RF) power may be applied between the upper and lower electrodes 60 and 70. In addition, the lower electrode 70 may function as a chuck supporting the substrate 2.

The apparatus treats the substrate 2 using reaction gases supplied to the chamber 50. After the reaction gases are supplied to the chamber 50, the reaction gases are excited to form a plasma by an electric field generated between the upper and lower electrodes 60 and 70. The plasma may react with the substrate 2 or a thin film on the substrate 2 during a plasma treatment process. For example, the plasma may react with the substrate 2 to form a thin film on the substrate 2. In addition, the plasma may react with a thin film on the substrate 2 to pattern the thin film.

As shown in FIG. 4, a plurality of injection holes 52 and a plurality of exhaust holes 54 are formed in a sidewall of the chamber 50. The plurality of injection holes 52 are spaced apart from each other along a horizontal direction by a substantially equal distance. Similarly, the plurality of exhaust holes 54 are spaced apart from each other by a substantially equal distance. In addition, the plurality of injection holes 52 and the plurality of exhaust holes 54 may have substantially the same shape and the same size. The plurality of injection holes 52 and the plurality of exhaust holes 54 face each other, and the substrate 2 is disposed between the plurality of injection holes 52 and the plurality of exhaust holes 54. Each injection hole 52 and each exhaust hole 54 have a standing rectangular shape such that a height "H" is greater than a width "W." For example, each injection hole 52 and each exhaust hole 54 may have a height within a range of about 2.0 mm to about 6.0 mm, a width within a range of about 1.5 mm to about 5.5 mm and a spaced distance within a range of about 20.5 to about 24.5 mm. Specifically, each injection hole 52 and each exhaust hole 54 may have a height of about 4.2 mm, a width of about 3.5 mm and a spaced distance of about 20.5 mm.

Referring back to FIG. 3, each injection hole 52 is connected to a first buffer cavity 56 in the sidewall of the chamber 50 and each exhaust hole 54 is connected to a second buffer cavity 58 in the sidewall of the chamber 50. Accordingly, the reaction gases supplied to the chamber 50 are injected into the chamber 50 through the first buffer cavity 56 and the plurality of injection holes 52, flow along a top surface of the substrate 2 and are exhausted out of the chamber 50 through the plurality of exhaust holes 54 and the second buffer cavity 58. The first buffer cavity 56 may be connected to a gas supply system (not shown) through an inlet pipe 92 and the second buffer cavity 58 is connected to a vacuum system (not shown) such as a pump through an output pipe 18.

The first and second buffer cavities 56 and 58 may be bent to change a flow path of the reaction gases. For example, the first buffer cavity 56 may change an input flow path of the reaction gases upwardly and horizontally. Accordingly, the reaction gases supplied from the exterior flow through the first buffer cavity 56 sequentially along a horizontal direction, an upward direction and a horizontal direction. Then, the reaction gases are injected into the chamber 50 through the plurality of injection holes 52. In addition, the second buffer cavity 58 may change an output flow path of the reaction gases upwardly, horizontally and downwardly. Accordingly, the reaction gases processed in the chamber 50 flow through the second buffer cavity 58 sequentially along a horizontal direction, an upward direction, a horizontal direction, a downward direction and a horizontal direction. Then, the reaction gases are exhausted through the plurality of exhaust holes 54.

Before the reaction gases are injected into the chamber 50, the reaction gases are uniformly diffused in the first buffer cavity 56. In addition, after the reaction gases are uniformly exhausted from the chamber 50, the reaction gases are concentrated in the second buffer cavity 58. Accordingly, a uniformity of the pressure of the distributed reaction gases and the processed reaction gases is improved.

Figure 5A:
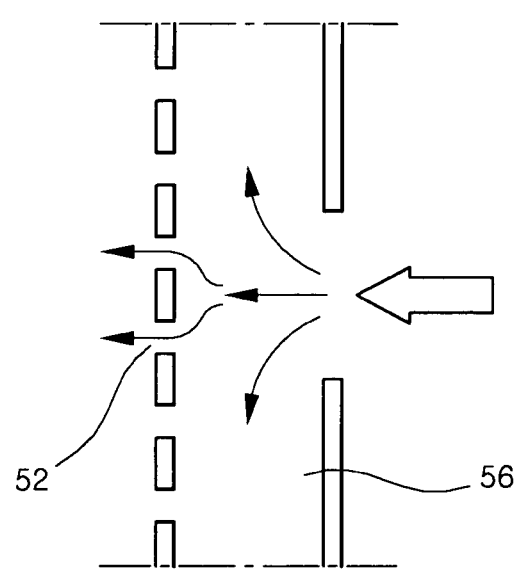
FIG. 5A is a schematic cross-sectional view taken along a line "Va-Va" of FIG. 4.
Figure 5B:
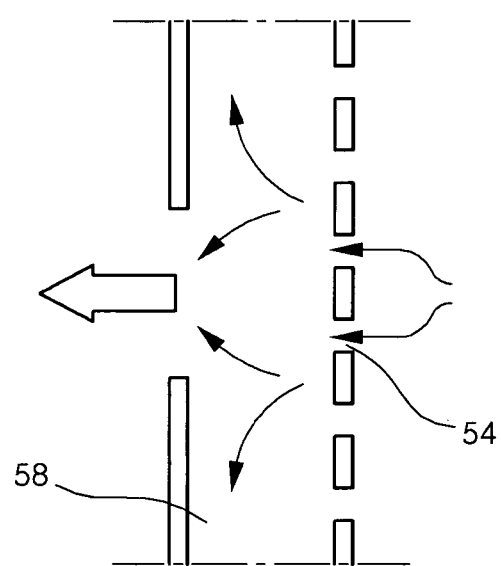
FIG. 5B is a schematic cross-sectional view taken along a line "Vb-Vb" of FIG. 4.

FIG. 5A is a schematic cross-sectional view taken along a line "Va-Va" of FIG. 4 and FIG. 5B is a schematic cross-sectional view taken along a line "Vb-Vb" of FIG. 4.

In FIG. 5A, the reaction gases supplied from the exterior are diffused in the first buffer cavity 56 to increase the pressure uniformity. Then, the reaction gases having passed through the first buffer cavity 56 are injected into the chamber 50 through the plurality of injection holes 52. The reaction gases flowing to a blocking portion between two adjacent injection holes 52 are substantially equally distributed to the two adjacent injection holes 52. Accordingly, the reaction gases are uniformly distributed by all the plurality of injection holes 52 and the uniformity of the reaction gases further increases. As a result, an injection uniformity of the reaction gases is improved.

In FIG. 5B, the reaction gases processed in the chamber 50 are exhausted to the second buffer cavity 58 through the plurality of exhaust holes 54. The reaction gases flowing to a blocking portion between two adjacent exhaust holes 54 are substantially equally distributed to the two adjacent exhaust holes 54. Accordingly, the reaction gases are uniformly distributed to by all the plurality of exhaust holes 54. Then, the reaction gases are concentrated in the second buffer cavity 58 and evacuated out of the chamber 50. Since the reaction gases are exhausted through the plurality of exhaust holes 54, the exhaust uniformity of the reaction gases are improved.

Although the first and second buffer cavities 56 and 58 are formed in the sidewall of the chamber 50 in the embodiment illustrated in FIGS. 5A and 5B, in another embodiment, an additional means such as a baffle may be formed inside the sidewall of the chamber 50. In addition, the side flow type apparatus may include not only a chemical vapor deposition (CVD) apparatus and a dry etching apparatus, but also the other kinds of apparatus for fabricating an LCD device having a side flow type.

Consequently, in an apparatus for fabricating a semiconductor device according to the present invention, a pressure of reaction gases is kept uniform regardless of positions in a chamber. As a result, a fabrication process in the apparatus such as deposition of a thin film and etch of a thin film has an improved uniformity and reliability, thereby obtaining an improved semiconductor device.

It will be apparent to those skilled in the art that various modifications and variations can be made in the apparatus for fabricating a semiconductor or liquid crystal display device of the present invention without departing from the sprit or scope of the invention. Thus, it is intended that the present invention covers the modifications and variations of this invention provided they come within the scope of the appended claims and their equivalents.

What is claimed is:

1. An apparatus for fabricating a semiconductor device comprising:
   a chamber having a sidewall;
   a susceptor in the chamber;
   a plurality of injection holes in the sidewall, the plurality of injection holes disposed along a horizontal direction and arranged in a single row, each of the plurality of injection holes in direct communication with the chamber;
   a plurality of exhaust holes in the sidewall, the plurality of exhaust holes disposed along the horizontal direction and facing the plurality of injection holes with the susceptor therebetween, wherein the plurality of exhaust holes are arranged in a single row;
   one first buffer cavity having a bent portion, one end of the one first buffer cavity connected to the plurality of injection holes;
   one inlet pipe connected to the other end of the one first buffer cavity;
   a second buffer cavity having a U-shape, one end of the second buffer cavity connected to the plurality of exhaust holes; and
   an outlet pipe connected to the other end of the second buffer cavity,
   wherein the one first buffer cavity has the bent portion therein to diffuse reaction gases in the one first buffer cavity and to change a flow path of the reaction gases,
   wherein the second buffer cavity has the U-shape therein to concentrate the reaction gases in the second buffer cavity and to change the flow path of the reaction gases.

2. The apparatus according to claim 1, wherein reaction gases are injected into the chamber through the first cavity and the plurality of injection holes, and exhausted from the chamber reaction through the plurality of exhaust holes and the second buffer cavity.

3. The apparatus according to claim 2, further comprising an inlet pipe connected to the first buffer cavity and an outlet pipe connected to the second buffer cavity, wherein the reaction gases are supplied to the first buffer cavity through the inlet pipe and evacuated from the second buffer cavity through the outlet pipe.

4. The apparatus according to claim 1, wherein the plurality of injection holes are spaced apart from each other by a substantially equal distance, and the plurality of exhaust holes are spaced apart from each other by a substantially equal distance.

5. The apparatus according to claim 4, wherein the plurality of injection holes and the plurality of exhaust holes have substantially the same shape and substantially the same size.

6. The apparatus according to claim 5, wherein each of the plurality of injection holes and the plurality of exhaust holes have a standing rectangular shape such that a height of the standing rectangular shape is greater than a width of the standing rectangular shape.

7. The apparatus according to claim 6, wherein the height is within a range of about 2.0 mm to about 6.0 mm, the width is within a range of about 1.5 mm to about 5.5 mm, a distance between two adjacent injection holes is within a range of about 20.5 mm to about 24.5 mm, and a distance between two adjacent exhaust holes is within a range of about 20.5 mm to about 24.5 mm.

8. The apparatus according to claim 1, further comprising first and second electrodes facing each other in the chamber, a radio frequency power source coupled to the first and second electrodes to generate a plasma.

9. The apparatus according to claim 8, wherein the first electrode includes the susceptor.

10. The apparatus according to claim 1, wherein the apparatus comprises one of a chemical vapor deposition apparatus or a dry etching apparatus.

11. An apparatus for fabricating a semiconductor device comprising:
- a chamber having a plurality of injection holes and a plurality of exhaust holes for transport of reaction gases through the chamber in a flow direction from the plurality of injection holes toward the plurality of exhaust holes, wherein the plurality of injection holes are arranged in a first single row and the plurality of exhaust holes are arranged in a second single row, each of the plurality of injection holes in direct communication with the chamber;
- a gas supply apparatus and a gas exhaust apparatus coupled to the chamber;
- a first structure in communication with the plurality of injection holes and the gas supply apparatus and a second structure in communication with the plurality of exhaust holes and the gas exhaust apparatus, the first structure including one first buffer cavity having a bent portion, one end of the one first buffer cavity connected to the plurality of injection holes, the second structure including a second buffer cavity having a U-shape, one end of the second buffer cavity connected to the plurality of exhaust holes;
- one inlet pipe connected to the other end of the one first buffer cavity; and
- an outlet pipe connected to the other end of the second buffer cavity,
- wherein the first and second structure change a flow of reaction gas with respect to the flow direction, the one first buffer cavity has the bent portion therein to diffuse the reaction gases in the one first buffer cavity and to change the flow path of the reaction gases, and the second buffer cavity has the U-shape therein to concentrate the reaction gases in the second buffer cavity and to change a flow path of the reaction gases.

12. The apparatus according to claim 11 further comprising a susceptor positioned in the chamber, wherein the plurality of injection holes are disposed in a horizontal direction in a chamber sidewall and the plurality of exhaust holes are disposed in the horizontal direction in the chamber sidewall and face the plurality of injection holes with the susceptor therebetween.

13. The apparatus according to claim 11, wherein the plurality of injection holes are spaced apart from each other by a substantially equal distance, and the plurality of exhaust holes are spaced apart from each other by a substantially equal distance.

14. The apparatus according to claim 11, wherein the plurality of injection holes and the plurality of exhaust holes have substantially the same shape and substantially the same size.

15. The apparatus according to claim 14, wherein each of the plurality of injection holes and the plurality of exhaust holes have a standing rectangular shape such that a height of the standing rectangular shape is greater than a width of the standing rectangular shape.

* * * * *